（12）United States Patent
Tucholski

(10) Patent No.: US 7,365,608 B2
(45) Date of Patent: Apr. 29, 2008

(54) DIGITAL FREQUENCY SYNTHESISER AND A METHOD FOR PRODUCING A FREQUENCY SWEEP

(75) Inventor: Hans Juergen Tucholski, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/297,003

(22) Filed: Dec. 8, 2005

(65) Prior Publication Data

US 2006/0139102 A1 Jun. 29, 2006

Related U.S. Application Data

(60) Provisional application No. 60/635,184, filed on Dec. 10, 2004.

(51) Int. Cl.
*H03B 23/00* (2006.01)
(52) U.S. Cl. ............................................ 331/4; 331/178
(58) Field of Classification Search ............... 331/4, 331/19, 178
See application file for complete search history.

(56) References Cited

U.S. PATENT DOCUMENTS

| | | | |
|---|---|---|---|
| 5,331,293 A | | 7/1994 | Shepherd et al. |
| 5,379,001 A | * | 1/1995 | Hedtke ............................ 331/4 |
| 6,066,967 A | | 5/2000 | Cahill et al. |
| 6,252,464 B1 | * | 6/2001 | Richards et al. ................ 331/4 |

FOREIGN PATENT DOCUMENTS

GB    2010032    6/1979

OTHER PUBLICATIONS

International search report, PCT/IE2005/000142, Jun. 26, 2006.

Wang, Hong-wei, et al, "High speed digital-to-analog converter with linear interpolator", IEEE Transactions on Consumer Electronics, vol. 46, No. 4, Nov. 2000, pp. 1137-1142.

* cited by examiner

*Primary Examiner*—Benny T. Lee
*Assistant Examiner*—James Goodley
(74) *Attorney, Agent, or Firm*—Wolf, Greenfield & Sacks P.C.

(57) ABSTRACT

A single chip digital frequency synthesiser (1) for synthesising a frequency swept synthesised output signal of a selectable frequency sweep comprises a direct digital synthesiser (5) which produces the frequency swept synthesised output signal on an output terminal (7) in response to values of a frequency control digital word applied to a frequency control input (8) thereof by an on-chip data processing circuit (25). An on-chip programmable data storing circuit (12) is programmable to store data indicative of a selected mode in which the digital frequency synthesiser (1) is to operate, and to store data indicative of selectable frequency and the time domains of the frequency swept synthesised output signal to be produced. The data processing circuit (25) reads the mode of operation and the frequency domain data and if appropriate the time domain data of a frequency swept synthesised output signal to be produced by the digital frequency synthesiser (1) from the data storing circuit (12), and computes the values of the frequency control digital word and the sequence in which the values of the frequency control digital word are to be applied to the direct digital synthesiser (5). Depending on the mode of operation, the data processing circuit (25) determines the rate at which the values of the frequency control digital word are to be applied to the direct digital synthesiser (5) in response to a logic control signal applied to a control terminal (20) or as a function of a number of clock cycles of a system clock signal applied on a system clock terminal (10) or a number of cycles of the frequency swept synthesised output signal. The frequency swept synthesised output signal may also be produced in frequency bursts.

34 Claims, 5 Drawing Sheets

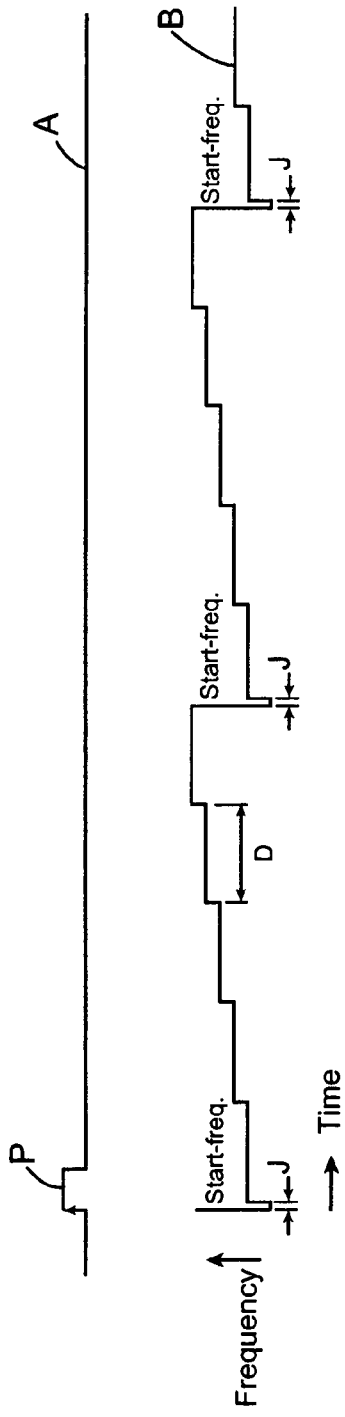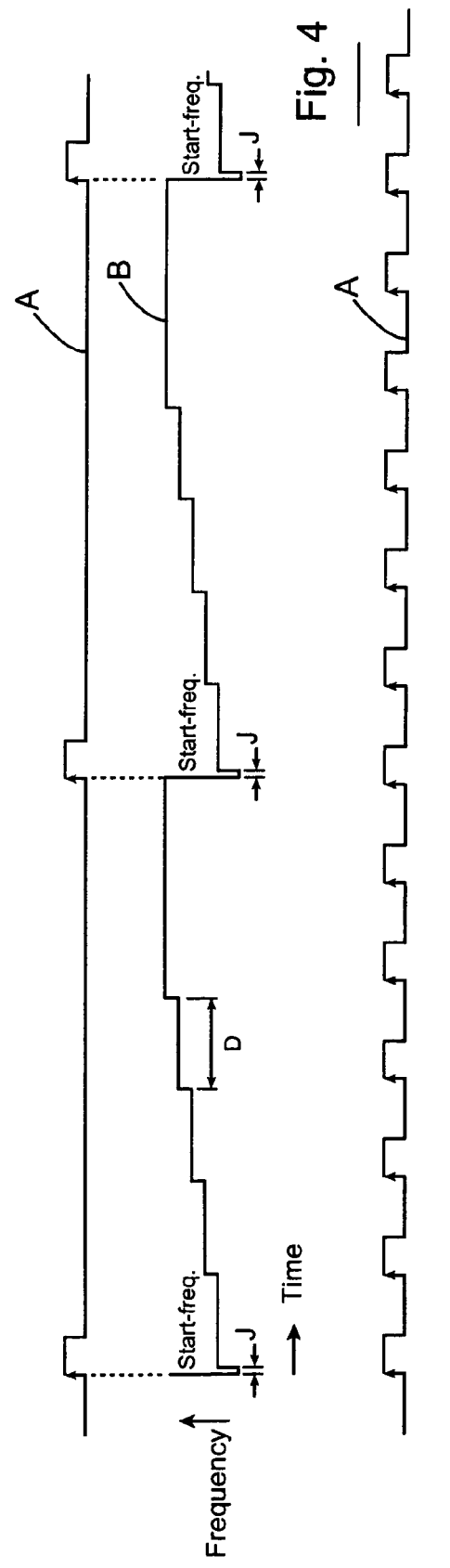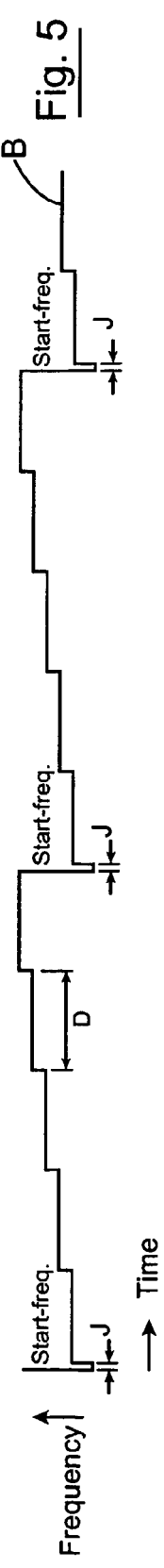

DIGITAL FREQUENCY SYNTHESISER AND A METHOD FOR PRODUCING A FREQUENCY SWEEP

FIELD OF THE INVENTION

Priority under 35 U.S.C. Section 119(e) is hereby claimed to U.S. Provisional Application Ser. No. 60/635,184 filed on Dec. 10, 2004 entitled "A DIGITAL FREQUENCY SYNTHESISER AND A METHOD FOR PRODUCING A FREQUENCY SWEEP".

The present invention relates to a digital frequency synthesiser and to a method for producing a frequency swept synthesised output signal, the frequency of which is swept through a plurality of frequencies of a frequency sweep.

BACKGROUND TO THE INVENTION

Digital frequency synthesisers are commonly used for synthesising a swept frequency output signal waveform, the frequency of which is stepped through a plurality of frequencies in order to produce a frequency sweep. A typical prior art digital frequency synthesiser is illustrated in FIG. 1, and is indicated generally by the reference numeral 100. The prior art digital frequency synthesiser 100 comprises a direct digital frequency synthesiser 101 which produces the frequency swept synthesised output signal on an output terminal 102. The direct digital synthesiser 101 comprises a numerical controlled oscillator (not shown) which is clocked by a system clock, and sequentially produces digital data words indicative of the phase of an output signal to be synthesised in response to a frequency control digital word applied to a frequency control input 104 of the direct digital synthesiser 101. A digital signal processing circuit (also not shown) in the direct digital synthesiser 101 converts the digital data words from the numerical controlled oscillator (not shown) into phase dependent magnitude digital words, which are in turn converted to the synthesised output signal waveform in a digital-to-analogue converter (not shown) also in the direct digital synthesiser 101, and the synthesised output signal is produced on the output terminal 102. By periodically and appropriately altering the value of the frequency control digital word applied to the frequency control input 104, the frequency of the synthesised output signal produced on the output terminal 102 is correspondingly altered for sweeping the frequency of the synthesised output signal through a frequency sweep. The system clock signal is typically externally derived, and is applied to a system clock input terminal 105 of the digital frequency synthesiser 100, and in turn is applied to a clock input 106 of the direct digital synthesiser 101. Typically, a numerical controlled oscillator comprises a modulo-M accumulator which repeatedly accumulates each value of the frequency control digital word as the values of the frequency control digital words are sequentially applied to the frequency control input 104. A reset input 108 of the direct digital synthesiser 101 is provided for applying a reset signal for resetting the numerical controlled oscillator and the digital signal processing circuit of the direct digital synthesiser 101.

The values of the frequency control digital word and the rate at which, and the sequence in which, the values of the frequency control digital word are to be applied to the frequency control input 104 of the direct digital synthesiser 101 is determined externally, for example, by a computer, or as illustrated in FIG. 1 by a microcontroller 110. The digital frequency synthesiser 100 comprises a pair of addressable frequency control digital word storing registers 112 for alternately storing the current value of the frequency control digital word to be applied to the frequency control input 104 of the direct digital synthesiser 101 and the next value thereof. The values of the frequency control digital word determined by the microcontroller 110 are applied to the frequency control digital word storing registers 112 in the appropriate sequence by the microcontroller 110 through a serial communication port 115 and an asynchronous digital interface circuit 114 of the digital frequency synthesiser 100. Alternate values of the frequency control digital word are written to the respective frequency control digital word storing registers 112 so that the current and next values of the frequency control digital word are alternately stored in one of the frequency control digital word storing registers 112, and the next and current values of the frequency control digital word are alternately stored in the other of the frequency control digital word storing registers 112. Accordingly, while the current value of the frequency control digital word is being applied to the frequency control input 104 of the direct digital synthesiser 101 from one of the frequency control digital word storing registers 112, the next value of the frequency control digital word is being written to the other of the frequency control digital word storing registers 112.

A multiplexer 116 of the digital frequency synthesiser 100 is operated under the control of the microcontroller 110 for selectively and alternately applying the values of the frequency control digital word stored in the respective frequency control digital word storing registers 112 to the frequency control input 104 of the direct digital synthesiser 101. A timing signal applied by the microcontroller 110 to the multiplexer 116 through a terminal 118 of the digital frequency synthesiser 100 operates the multiplexer 116 for selectively and alternately applying the values of the frequency control digital word stored in the frequency control digital word storing registers 112. A reset signal from the microcontroller 110 is applied to the reset input 108 of the direct digital synthesiser 101 through a terminal 120 of the digital frequency synthesiser 100 for resetting the direct digital synthesiser 100.

The output frequency of the synthesised output signal produced on the output terminal 102 can be represented by the following equation:

$$f_{out} = \frac{FCD}{MOD} \cdot f_s$$

where
  $f_{out}$ is the frequency of the synthesised output signal,
  $f_s$ is the frequency of the system clock signal applied to the system clock input terminal 105 at which the direct digital synthesiser 101, and in turn the accumulator is clocked,
  FCD is the value of the frequency control digital word applied to the accumulator, and
  MOD is the value of the modulus M of the accumulator.

In order to produce a frequency swept synthesised output signal with a predefined frequency sweep, the frequency sweep must be defined in the frequency domain and in the time domain. In general, the synthesised frequency output signal is swept through a sequence of frequencies in ascending or descending order of frequencies, and in general, in an ascending order of frequencies. Thus, where the sequence of frequencies through which the synthesised output signal is to be swept is an ascending order of frequencies, in general, the frequency domain is defined by the start frequency, which is the lowest frequency of the frequency sweep and the end frequency, which is the highest frequency of the frequency sweep, and the number of frequencies through which the frequency is to be stepped. The time domain of the frequency sweep is defined by the duration of each frequency step, in other words, the time interval between two consecutive changes in the frequency of the synthesised output signal. In cases where the frequency swept synthesised output signal is to be provided with bursts of the frequencies during respective frequency steps of the frequency sweep, the duration of each frequency burst within the duration of each frequency step must also be defined as part of the time domain of the frequency sweep. Thus, in the digital frequency synthesiser 100 data defining the frequency sweep in the frequency domain is written to the data registers 112 through the interface circuit 114, and data defining the frequency sweep in the time domain is provided by the microcontroller 110 through the timing terminal 118. Other arrangements for providing data defining the frequency and time domains of the frequency sweep of a desired frequency swept synthesised output signal to a digital frequency synthesiser will be known to those skilled in the art.

In general, it is desirable that the frequency sweep of a frequency swept synthesised output signal produced by a digital frequency synthesiser should be produced with a predefined relationship with respect to time. For example, in many cases it is desirable that the frequency sweep produced by a digital frequency synthesiser should be produced with a predefined linear relationship with respect to time with the durations of the respective frequency steps being constant. Such a frequency sweep is produced by applying the values of the frequency control digital word to the frequency control input of the direct digital synthesiser at a constant rate. In general, in digital frequency synthesisers known heretofore, it is difficult to achieve linearity of the frequency sweep with respect to time, since the values of the frequency control digital word are not always provided on time to the digital frequency synthesiser, or where the values of the frequency control digital words are provided on time, they are not always applied on time to the direct digital synthesiser. This is due to the fact that the values of the frequency control digital word are computed and applied to the direct digital synthesiser by external devices, such as, as described with reference to FIG. 1, where the values of the frequency control digital word are computed by the microcontroller 110, and are applied to the frequency control input 104 of the direct digital synthesiser 101 under the control of the microcontroller 110. In general, such devices carry out other functions and tasks, as a result of which delays in applying the next value of the frequency control digital word may occur. In which case, the predefined relationship of the frequency sweep with respect to time no longer exists. This is undesirable.

The present invention is directed towards providing a digital frequency synthesiser and a method for producing a frequency swept synthesised frequency output signal, the frequency of which is swept through a plurality of frequencies of a frequency sweep with a predefined time relationship.

SUMMARY OF THE INVENTION

According to the invention there is provided a digital frequency synthesiser for producing a frequency swept synthesised output signal, the digital frequency synthesiser being implemented on a single chip, and comprising:

an on-chip direct digital frequency synthesiser for producing a synthesised output signal of frequency responsive to a frequency control digital word applied thereto, an on-chip data storing circuit for storing data defining a frequency sweep of the frequency swept synthesised output signal in the frequency domain and in the time domain, a control terminal for receiving an externally generated control signal, an on-chip data processing circuit for determining from the frequency domain data stored in the data storing circuit respective values of the frequency control digital word and the sequence thereof in which the values of the frequency control digital word are to be applied to the direct digital synthesiser for producing the frequency swept synthesised output signal, the data processing circuit being responsive to one of the data stored in the data storing circuit defining the time domain of the frequency sweep, a control signal applied to the control terminal, and a combination of a control signal applied to the control terminal and data stored in the data storing circuit defining the time domain of the frequency sweep for determining the rate at which the values of the frequency control digital word are to be applied to the direct digital synthesiser and for applying the values of the frequency control digital word in the sequence and at the determined rate to the direct digital synthesiser for producing the frequency swept synthesised output signal.

In one embodiment of the invention the data storing circuit is adapted for storing the frequency domain data in the form of data indicative of one of a start frequency and an end frequency of the frequency sweep of the frequency swept synthesised output signal. Preferably, the data storing circuit is adapted for storing the frequency domain data in the form of data indicative of one of a frequency increment and a frequency decrement by which the frequency is to be altered between consecutive frequency steps of the frequency sweep of the frequency swept synthesised output signal. Advantageously, the data storing circuit is adapted for storing the frequency domain data in the form of data indicative of the number of frequency steps of the frequency sweep of the frequency swept synthesised output signal.

In another embodiment of the invention the data storing circuit is adapted for storing the time domain data in the form of data indicative of the duration of each frequency step of the frequency sweep of the frequency swept synthesised output signal. Preferably, the data storing circuit is adapted for storing the time domain data in the form of data indicative of the duration of each frequency burst of the frequency sweep of the frequency swept synthesised output signal.

In one embodiment of the invention the data processing circuit is responsive to a control signal applied to the control terminal for determining when a first value of the sequence of values of the frequency control digital word is to be applied to the direct digital synthesiser.

In another embodiment of the invention the data processing circuit is responsive to a control signal applied to the control terminal for determining the time domain of the frequency sweep of the frequency swept synthesised output signal.

In a further embodiment of the invention the data processing circuit is responsive to a control signal applied to the control terminal for determining the duration of each frequency step of the frequency swept synthesised output signal.

In a still further embodiment of the invention the data processing circuit is responsive to a control signal applied to the control terminal for determining the duration of each frequency burst of the frequency sweep of the frequency swept synthesised output signal for producing the frequency swept synthesised output signal in frequency bursts.

In another embodiment of the invention the data processing circuit is responsive to the mark space ratio of a logic control signal applied to the control terminal for determining the ratio of the duration of each frequency burst to the duration of the corresponding frequency step of the frequency swept synthesised output signal.

Preferably, the data processing circuit is responsive to a logic control signal applied to the control terminal.

In another embodiment of the invention the data processing circuit is adapted for computing the time domain data of the frequency sweep as a function of a number of cycles of an oscillating signal from the time domain data stored in the data storing circuit, and the data processing circuit is responsive to the oscillating signal for determining the rate at which the values of the frequency control digital word are to be applied to the direct digital synthesiser.

In a further embodiment of the invention the data processing circuit is responsive to the oscillating signal for determining the duration of each frequency step of the frequency swept synthesised output signal.

In a still further embodiment of the invention the data processing circuit is responsive to the oscillating signal for determining the duration of each frequency burst of the frequency sweep of the frequency swept synthesised output signal for producing the frequency swept synthesised output signal in frequency bursts.

In one embodiment of the invention the oscillating signal to which the data processing circuit is responsive is a system clock signal at which the digital frequency synthesiser is clocked. Preferably, the system clock signal is an externally generated system clock signal, and a clock terminal is provided for receiving the system clock signal.

In another embodiment of the invention the oscillating signal is the frequency swept synthesised output signal.

In one embodiment of the invention the direct digital synthesiser comprises a numerical controlled oscillator responsive to the values of the frequency control digital word for sequentially producing digital words indicative of the phase of the frequency swept synthesised output signal. Preferably, the numerical controlled oscillator comprises a modulo-M accumulator responsive to the values of the frequency control digital word for sequentially producing the digital words indicative of the phase of the frequency swept synthesised output signal.

In another embodiment of the invention the data processing circuit is responsive to an overflow signal from the accumulator for determining the rate at which the values of the frequency control digital word are to be applied to the accumulator.

Advantageously, the direct digital synthesiser comprises a digital signal processing circuit for producing phase dependent magnitude digital words from the digital words indicative of the phase of the frequency swept synthesised output signal produced by the numerical controlled oscillator. Preferably, the direct digital synthesiser comprises a DAC for converting the phase dependent magnitude digital words produced by the digital signal processing circuit to the frequency swept synthesised output signal.

Preferably, the data storing circuit is programmable for facilitating programming of the frequency domain data of the frequency swept synthesised output signal. Advantageously, the data storing circuit is programmable for facilitating programming of the time domain data of the frequency swept synthesised output signal. Ideally, the data storing circuit is programmable for facilitating selection of a mode of operation in which the digital frequency synthesiser is to be operated.

In one embodiment of the invention the digital frequency synthesiser is adapted for producing the frequency swept synthesised output signal in the form of a sine wave. In an alternative embodiment of the invention the digital frequency synthesiser is adapted for producing the frequency swept synthesised output signal in the form of an arbitrary signal. In another alternative embodiment of the invention the digital frequency synthesiser is adapted for producing the frequency swept synthesised output signal in the form of a logic signal.

Additionally the invention provides a method for producing a frequency swept synthesised output signal, the method comprising:

implementing a digital frequency synthesiser on a single chip, whereby the digital frequency synthesiser comprises:

an on-chip direct digital frequency synthesiser for producing a synthesised output signal of frequency responsive to a frequency control digital word applied thereto, an on-chip data storing circuit for storing data defining a frequency sweep of the frequency swept synthesised output signal in the frequency domain and in the time domain, a control terminal for receiving an externally generated control signal, an on-chip data processing circuit for determining from the frequency domain data stored in the data storing circuit respective values of the frequency control digital word and the sequence thereof in which the values of the frequency control digital word are to be applied to the direct digital synthesiser for producing the frequency swept synthesised output signal, the data processing circuit being responsive to one of the data stored in the data storing circuit defining the time domain of the frequency sweep, a control signal applied to the control terminal, and a combination of a control signal applied to the control terminal and data stored in the data storing circuit defining the time domain of the frequency sweep for determining the rate at which the values of the frequency control digital word are to be applied to the direct digital synthesiser, and operating the data processing circuit for determining from the frequency domain data stored in the data storing circuit respective values of the frequency control digital word and the sequence thereof in which the values of the frequency control digital word are to be applied to the direct digital synthesiser for producing the synthesised output signal, operating the data processing circuit for determining the rate at which the values of the frequency control digital word are to be applied to the direct digital synthesiser from one of the data stored in the data storing circuit defining the time domain of the frequency sweep, a control signal applied to the control terminal, and a combination of a control signal applied to the control terminal and data stored in the data storing circuit defining the time domain of the frequency sweep, and operating the data processing circuit for applying the values of the frequency control digital word in the sequence and at the determined rate to the direct digital synthesiser for producing the frequency swept synthesised output signal.

ADVANTAGES OF THE INVENTION

The advantages of the invention are many. By virtue of the fact that the respective values of the frequency control digital word are determined by the data processing circuit, which is on-chip, and are applied to the direct digital synthesiser by the data processing circuit, the values of the frequency control digital word are determined on time and most importantly are applied on time to the direct digital synthesiser, and thus no delay occurs in the application of the values of the frequency control digital word to the direct digital synthesiser, as has been a problem of digital frequency synthesisers known heretofore. Additionally, by virtue of the fact that the reset signal is applied to the direct digital synthesiser by the data processing circuit, likewise the reset signal is applied on time, and where appropriate in cases where the frequency swept synthesised output signal is to be produced in frequency bursts, no delays occur in the application of the reset signal to the direct digital synthesiser, and thus, a frequency swept synthesised output signal with accurately timed frequency bursts is produced.

A particularly important advantage of the invention is that the frequency swept synthesised output signal can be controlled in real time irrespective of whether the time domain of the frequency sweep of frequency swept synthesised output signal is being controlled by time domain data stored in the data storing circuit or by an externally generated control signal applied to the control terminal. Accordingly, the frequency sweep of the frequency swept synthesised output signal is produced with a predefined relationship with respect to time which may be a linear relationship with respect to time or otherwise.

By adapting the data storing circuit to store the frequency domain data in the form of data indicative of one of a start frequency or an end frequency of a frequency sweep, data indicative of one of a frequency increment or a frequency decrement by which the frequency is to be altered between consecutive frequency steps, and data indicative of the number of frequency steps of the frequency sweep, a further advantage of the invention is achieved by virtue of the fact that the frequencies of the respective frequency steps of a frequency sweep can be readily synthesised, since the values of the frequency control digital word which correspond to the respective frequencies of the frequency sweep can be readily computed.

A further advantage of the invention is achieved when the data storing circuit of the digital frequency synthesiser is programmable, the digital frequency synthesiser is selectively operable in a number of operational modes.

A particularly important advantage of the invention is achieved by virtue of the fact that the digital frequency synthesiser is implemented as an integrated circuit, which is implemented on a single chip. By virtue of the fact that the digital frequency synthesiser is self-contained on a single chip, and the single chip includes both the data storing circuit and the data processing circuit, the digital frequency synthesiser according to the invention is independently operable, and as discussed above, thus produces a frequency swept synthesised output signal of a frequency sweep or frequency sweeps which have a predefined relationship with respect to time.

Additionally, the digital frequency synthesiser according to the invention can be implemented on a single chip with the minimum number of pins. Apart from normal power supply pins, the only additional pins required are those of the control terminal, the output terminal, and a system clock terminal for receiving a system clock signal. Where the data storing circuit is programmable, a suitable communications port for facilitating programming thereof is required. Indeed, if the digital frequency synthesiser were produced with an on-chip system clock, the system clock terminal could be dispensed with. Thus, with the minimum number of pins, a single chip digital frequency synthesiser is provided according to the invention, which produces a frequency swept synthesised output signal with a frequency sweep which has a predefined relationship with respect to time.

The invention and its many advantages will be readily apparent to those skilled in the art from the following description of some preferred embodiments thereof, which are given by way of example only, with reference to the accompanying drawings.

BRIEF DESCRIPTION OF THE DRAWINGS

FIGS. 3 to 7 illustrate graphical representations of signals applied to and produced by the digital frequency synthesiser of FIG. 2.

DETAILED DESCRIPTION OF PREFERRED EMBODIMENTS

Figure 1:
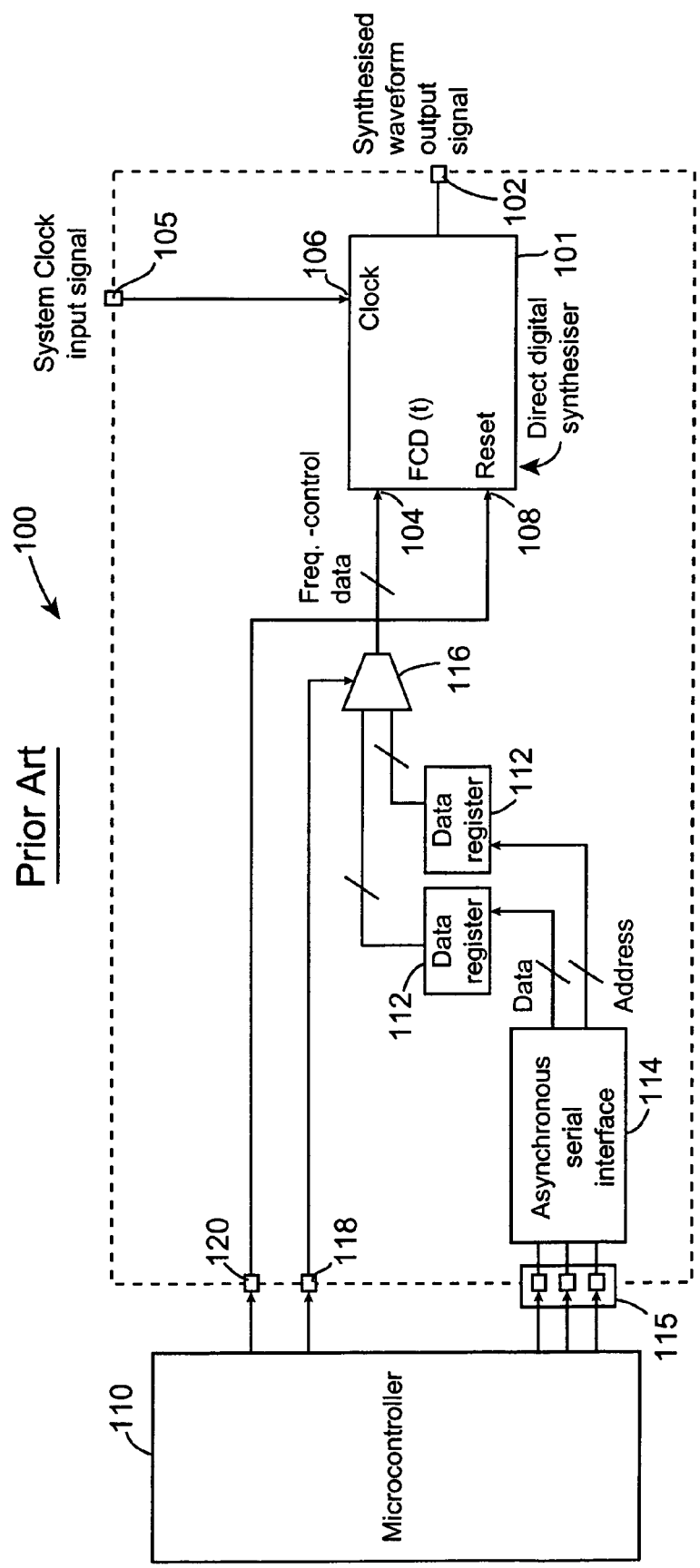
FIG. 1 is a block representation of a prior art digital frequency synthesiser configured for producing a frequency swept synthesised output signal, the frequency of which is swept through a plurality of frequencies of a frequency sweep.
Figure 2:
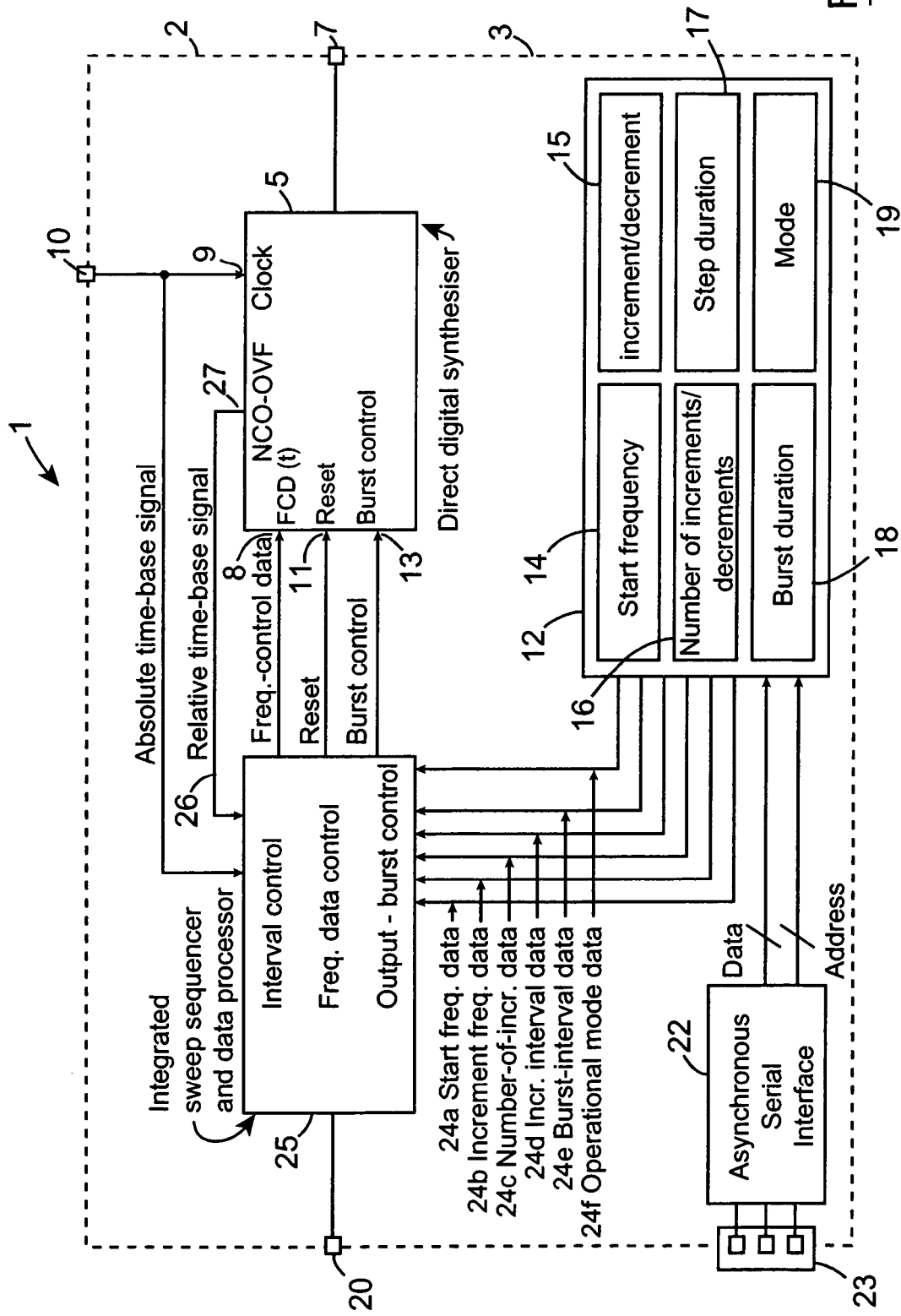
FIG. 2 is a block representation of a digital frequency synthesiser according to the invention for producing a frequency swept synthesised output signal, the frequency of which is swept through a plurality of frequencies of a frequency sweep.

Referring to the drawings, and initially to FIGS. 2 to 8, there is illustrated a digital frequency synthesiser according to the invention, indicated generally by the reference numeral 1, for producing a frequency swept synthesised output analogue voltage signal in the form of a sine wave, the frequency of which is swept through a plurality of selectable frequencies of a selectable frequency sweep with a selectable relationship with respect to time. In this embodiment of the invention the frequencies and the duration of each frequency step, in other words, the time interval between consecutive changes in the frequency of the frequency swept synthesised output signal, as well as the number of frequency steps through which the frequency swept, synthesised output signal is swept are selectable. Additionally, the frequency swept synthesised output signal produced by the digital frequency synthesiser 1 may be produced as a frequency swept signal in which the frequency of each frequency step is provided for the duration of the frequency step, or alternatively, the frequency swept synthesised output signal may be produced in frequency bursts, whereby the frequency of each frequency step is produced for a selectable duration during each frequency step, and the duration during which the frequency is produced is less than the duration of the corresponding frequency step.

The digital frequency synthesiser 1 is implemented as a single chip integrated circuit digital frequency synthesiser on a single chip 2. The digital frequency synthesiser 1 comprises an on-chip direct digital frequency synthesiser 5 which produces the frequency swept synthesised output signal on a single pin output terminal 7 in response to respective values of a frequency control digital word, which are sequentially applied to a frequency control input 8 of the direct digital synthesiser 5. The direct digital synthesiser 5 is clocked by a system clock signal applied to a clock input 9 of the direct digital synthesiser 5, and in this embodiment of the invention the system clock signal is an externally generated signal and is applied to a single pin clock signal terminal 10 of the digital frequency synthesiser 1. A reset input 11 of the direct digital synthesiser 5 is provided for receiving a reset signal for resetting the direct digital synthesiser 5. A burst control input 13 of the direct digital synthesiser 5 is provided for receiving a burst control signal for operating the direct digital synthesiser 5 to produce the frequency swept synthesised output signal in frequency bursts, as will be described below.

An on-chip digital data storing circuit 12 formed on the single chip 2 stores frequency domain and time domain data for defining the frequency sweep of the frequency swept synthesised output signal in both the frequency and time domains. In this embodiment of the invention the digital frequency synthesiser 1 is particularly suitable for producing the frequency swept synthesised output signal with a frequency sweep in ascending order of frequencies, or descending order of frequencies. The data defining the frequency domain of a frequency sweep comprises three components, namely, the start frequency, which may be the lowest or the highest frequency of the frequency sweep, the frequency increment or the frequency decrement by which the frequency is to be altered between consecutive frequency steps of the frequency sweep, and the number of frequency steps through which the frequency is to be stepped in the frequency sweep. The data defining the time domain of a frequency sweep comprises two components, namely, the duration of each frequency step of the frequency sweep, and in cases where the frequencies of the frequency swept synthesised output signal are to be produced as frequency bursts, the duration of the frequency burst in each frequency step of the frequency sweep.

The data storing circuit 12 is programmable and comprises six programmable digital data storing registers, namely, first through sixth data storing registers 14 through 19, respectively, for storing digital words for defining the frequency sweep of the synthesised output frequency signal in the frequency and time domains. The first data storing register 14 is provided for storing data indicative of the start frequency of the frequency sweep, which may be the lowest frequency or the highest frequency of the frequency sweep, depending on whether the frequency sweep is to commence with the lowest frequency and be sequentially incremented to the highest frequency, or vice versa. The second data storing register 15 is provided for storing data indicative of the increment or decrement by which the frequency is to be incremented or decremented between frequency steps of the frequency swept synthesised output signal. The third data storing register 16 is provided for storing data indicative of the number of increments or decrements by which the frequency is to be incremented or decremented during the frequency sweep. Thus, the frequency domain of the frequency sweep is defined by the data stored in the first, second and third data storing registers 14 to 16.

The fourth data storing register 17 is provided for storing data indicative of the duration of each frequency step of the frequency sweep. The fifth data storing register 18 is provided for storing data indicative of the duration of the frequency burst corresponding to each frequency step of the frequency sweep, where the frequency swept synthesised output signal is to be provided in frequency bursts. The sixth data storing register 19 is provided for storing data indicative of the mode in which the digital frequency synthesiser 1 is to be operated. The digital frequency synthesiser 1 is selectively operable in a number of modes as will be described below whereby the time domain data of the frequency swept synthesised output signal may be determined from the data stored in either or both of the fourth and fifth data storing registers 17 and 18, a logic control signal applied to a single pin control terminal 20 of the digital frequency synthesiser 1, or a combination of time domain data stored in the fourth and fifth data storing registers 17 and 18 and a logic control signal applied to the control terminal 20.

An on-chip asynchronous serial interface circuit 22 is formed on the single chip 2 for interfacing the data storing circuit 12 with any suitable external programming device through a serial communication port 23 for programming the data storing circuit 12 for facilitating selection of the start frequency, the increment or decrement by which the start frequency is to be incremented or decremented, and the number of increments or decrements by which the frequency of the frequency sweep is to be incremented, as well as the duration of each frequency step and of each frequency burst, where relevant, as well as for selecting the mode of operation of the digital frequency synthesiser 1.

An on-chip digital data processing circuit 25, which is clocked by the system clock signal, is formed on the single chip 2 for computing the values of the frequency control digital word to be applied to the frequency control input 8 of the direct digital synthesiser 5 and the sequence in which the values of the frequency control digital word are to be applied to the frequency control input 8 from the data indicative of the start frequency, the increment or decrement and the number of increments stored in the first through the third data storing registers 14 to 16. The data processing circuit 25 also sequentially applies the respective values of the frequency control digital word in the determined sequence to the frequency control input 8 of the direct digital synthesiser 5 at a rate determined by the data processing circuit 25 from the data indicative of the duration of each frequency step stored in the fourth data storing registers 17, and/or from an externally generated logic control signal applied to the control terminal 20. If the frequency swept synthesised output signal is to be produced in frequency bursts, the data processing circuit 25 determines the duration of each frequency burst from the data indicative of the duration thereof stored in the fifth data storing register 18 and/or from an externally generated logic control signal applied to the control terminal 20. The data processing circuit 25 reads the data stored in the first through the sixth data storing registers 14 to 19 of the data storing circuit 12 through data buses 24*a* to 24*f*, respectively.

The rate at which the respective values of the frequency control digital word are applied to the frequency control input 8 of the direct digital synthesiser 5, which also determines the duration of each frequency step, may be determined solely by a logic control signal applied to the control terminal 20, in which case, on each one of a rising or falling edge of the logic control signal, the next value of the frequency control digital word is applied by the data processing circuit 25 to the frequency control input 8. Alternatively, the rate at which the respective values of the frequency control digital word are applied to the frequency control input 8 by the data processing circuit 25 may be determined solely by the data indicative of the duration of the frequency steps stored in the fourth data storing register 17.

Where the rate at which the respective values of the frequency control digital word are applied to the frequency control input 8 is determined from the data indicative of the duration of each frequency step stored in the fourth data storing register 17, the duration of each frequency step is determined as a function of an appropriate number of clock cycles of the system clock signal applied on the clock signal terminal 10 or as a function of an appropriate number of cycles of the frequency swept synthesised output signal produced on the output terminal 7. Where the duration of each frequency step of the frequency swept synthesised output signal is determined as an appropriate number of cycles of the frequency swept synthesised output signal, the data processing circuit 25 is responsive to an appropriate number of overflows of an accumulator (not illustrated in FIG. 2 but illustrated in FIG. 8 and described below) of the direct digital synthesiser 5 for sequentially applying the respective values of the frequency control digital word to the frequency control input 8 of the direct digital synthesiser 5 for in turn defining each frequency step. The data processing circuit 25 reads the number of overflows of the accumulator of the direct digital synthesiser on a line 26 from an overflow output 27 of the direct digital synthesiser 5.

Where the duration of the frequency steps of the frequency sweep of the frequency swept synthesised output signal is determined in response to an appropriate number of the clock cycles of the system clock signal, the frequency sweep of the frequency swept synthesised output signal is linear with respect to time. However, where the duration of the frequency steps of the frequency sweep is determined as a predetermined number of cycles of the frequency swept synthesised output signal, the frequency sweep of the frequency swept synthesised output signal is not linear with respect to time, but does have a predefined relationship with respect to time.

Where it is desired to produce a frequency swept synthesised output signal on the output terminal 5 in frequency bursts, and the duration of each frequency burst is to be determined from the data stored in the fifth data storing register 18 which is indicative of the duration of the frequency bursts, the duration of each frequency burst is determined as a function of an appropriate number of clock cycles of the system clock applied to the clock signal terminal 10, or as a function of an appropriate number of cycles of the frequency swept synthesised output signal, as already described with respect to the determination of the frequency step duration by the data processing circuit 25. At the end of the duration of each frequency burst a reset signal is applied to the reset input 11 and a burst control signal is applied to the burst control input 13 of the direct digital synthesiser 5 for the remaining duration of the corresponding frequency step, for operating the direct digital synthesiser to produce a steady state output signal until the commencement of the next frequency step of the frequency sweep, as will be described in more detail below with reference to FIG. 8.

Alternatively, the duration of each frequency step and the duration of the frequency burst of each frequency step is determined by a logic control signal applied to the control terminal 20. In which case, the respective values of the frequency control digital word are applied on respective rising edges of the logic control signal applied to the control terminal 20, and a reset signal is applied to the reset input 11 and a burst control signal is applied to the burst control input 13 of the direct digital synthesiser 5 on each falling edge of the logic control signal and are held on the respective reset input 11 and the burst control input 13 until the next rising edge of the logic control signal on the logic control terminal 20. At which stage, the next value of the frequency control digital word is applied to the frequency control input 8. Thus, the ratio of the duration of each frequency burst to the duration of the corresponding frequency step is determined by the mark space ratio of the logic control signal on the control terminal 20.

Figure 7:
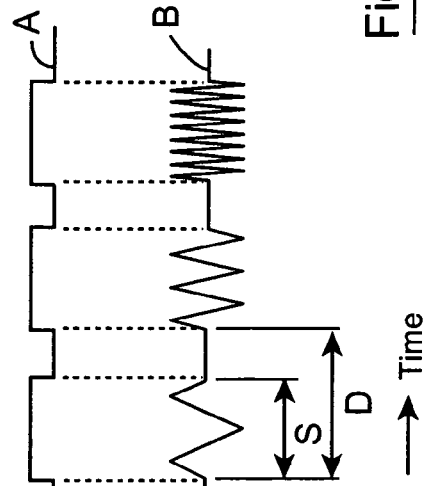
Figure 6:
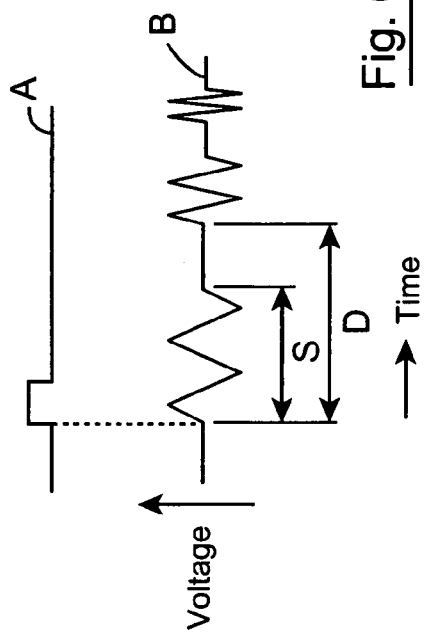

Referring now to FIGS. 3 to 7, waveforms of frequency swept synthesised output signals produced on the output terminal 7 of the digital frequency synthesiser 1 operating in different modes are illustrated. In each of FIGS. 3 to 7 the waveform A represents a logic control signal applied to the control terminal 20, and the waveform B represents the frequency swept synthesised output signal produced on the output terminal 7. In FIGS. 3 to 5 two frequency sweeps of the frequency swept synthesised output signal are represented by the waveforms B, which are plots of frequency on the Y-axis against time on the X-axis, and in the waveforms B of FIGS. 3 to 5, the frequency signal is continuously produced for the duration D of each frequency step. In FIGS. 6 and 7 the frequency swept synthesised output signals produced on the output terminal 7 of the digital frequency synthesiser 1 are produced in bursts of frequencies during the respective frequency steps, and the durations S of each frequency burst is illustrated in the waveforms B as an oscillating signal in the corresponding frequency step which is of duration D. Accordingly, in FIGS. 6 and 7 voltage of the waveforms B is plotted on the Y-axis against time on the X-axis. For convenience only three frequency steps of the frequency sweep of the frequency swept synthesised output signal are illustrated in FIGS. 6 and 7.

The frequency swept synthesised output signal produced on the output terminal 7 of the waveform of FIG. 3 is produced from both frequency domain data and time domain data of the frequency sweep, which is stored in the data storing circuit 12. The data processing circuit 25 in response to the rising edge of a pulse P of the logic control signal A applied to the control terminal 20 commences to initialise itself during a short initialisation period J, during which the data processing circuit 25 determines the values of the frequency control digital word of the frequency sweep, the sequence in which the values of the frequency control digital word are to be applied to the direct digital synthesiser 5 and the duration of each frequency step of the frequency sweep. During initialisation the data processing circuit 25 resets the direct digital synthesiser 5, and on completion of initialisation sequentially applies the values of the frequency control digital word in ascending order to the frequency control input 8 of the direct digital synthesiser 5 to produce the frequency swept synthesised output signal with a frequency sweep in which the frequencies of the signal are in ascending order. Additionally, at the end of each frequency sweep, the data processing circuit 25 again initialises itself and repeats the sequential application of the values of the frequency control digital word in ascending order to the frequency control input 8 of the direct digital synthesiser 5 for producing the frequency swept synthesised output signal with repeating frequency sweeps.

In this mode of operation, on detecting the rising edge of the pulse P of the logic control signal A, the data processing circuit 25 commences initialisation, and reads the data indicative of the selected mode of operation in which the digital frequency synthesiser 1 is to operate from the sixth data storing register 19. The data processing circuit 25 then reads the data indicative of the selected start frequency from the first data storing register 14, the data indicative of the selected increment by which the frequency is to be incremented between consecutive frequency steps from the second data storing register 15, and the data indicative of the selected number of increments by which the frequency is to be incremented from the third data storing register 16. From this data the data processing circuit 25 during the initialisation period J computes the values of the frequency control digital word to be applied to the direct digital synthesiser 5, and the sequence in which the values of the frequency control digital word are to be applied. The data processing circuit 25 reads the data indicative of the duration of the frequency step from the fourth data storing register 17. In this mode of operation the frequency sweeps are to be produced with a linear relationship with respect to time, and thus the duration D of the frequency steps is constant. Accordingly, the data processing circuit 25 determines the time interval between the application of consecutive values of the frequency control digital word to the frequency control input 8 of the direct digital synthesiser 5 as a function of an appropriate number of clock cycles of the system clock signal. During the initialisation period, the data processing circuit 25 applies a reset signal to the reset input 11 of the direct digital synthesiser 5 for resetting the direct digital synthesiser 5, and then sequentially applies the values of the frequency control digital word to the frequency control input 8 of the direct digital synthesiser 5 on the appropriate clock cycles of the system clock signal.

The frequency swept synthesised output signal produced on the output terminal 7 of the waveform B of FIG. 4 is produced from both frequency domain data and time domain data stored in the data storing circuit 12, as well as in response to the logic control signal A applied to the control terminal 20. In this mode of operation the respective frequency sweeps of the frequency swept synthesised output signal are initiated by rising edges of respective pulses P of the logic control signal A on the control terminal 20. The data processing circuit 25 initialises itself in response to the rising edge of each pulse P of the logic control signal A, and then sequentially applies the values of the frequency control digital word to the direct digital synthesiser 5 for producing one frequency sweep, and waits for the rising edge of the next pulse P. However, otherwise, operation of the digital frequency synthesiser in this mode of operation for producing the waveform B of FIG. 4 is similar to that described with reference to FIG. 3, with the exception that the frequency swept synthesised output signal remains at the highest frequency of the frequency sweep until the rising edge of the next pulse of the logic control signal A is detected on the control terminal 20 by the data processing circuit 25.

The frequency swept synthesised output signal produced on the output terminal 7 of the waveform B of FIG. 5 is produced from frequency domain data only stored in the data storing circuit 12, however, the time domain of the frequency swept synthesised output signal B of FIG. 5 is determined solely by the logic control signal A applied to the control terminal 20. In this mode of operation the data processing circuit 25 on detecting the rising edge of the first pulse P of the logic control signal initialises itself during the initialisation period J. The data processing circuit 25 during initialisation reads the data indicative of the mode of operation from the sixth data storing register 19, the data indicative of the start frequency of the frequency sweep stored from the first data storing register 14, the data indicative of the increment by which the frequency is to be incremented from the second data storing register 15, and the data indicative of the number of increments by which the frequency is to be incremented from the third data storing register 16. From this data the data processing circuit 25 computes the values of the frequency control digital word and determines the sequence in which the values of the frequency control digital word are to be applied to the frequency control input 8 of the direct digital synthesiser 5.

During the initialisation period the data processing circuit resets the direct digital synthesiser 5, and then applies the first of the values of the frequency control digital word to the frequency control input 8 of the direct digital synthesiser 5 to produce the frequency of the first frequency step of the first frequency sweep of the frequency swept synthesised output signal, and waits for the rising edge of the next pulse P of the logic control signal A to apply the second value of the frequency control digital word to the frequency control input 8 of the direct digital synthesiser 5, and so on until the highest value of the frequency control digital word has been applied to the frequency control input 8 of the direct digital synthesiser 5. On the rising edge of the next pulse P of the logic control signal A, the data processing circuit 25 again initialises itself during the initialisation period J, resets the direct digital synthesiser 5, and applies the first value of the frequency control digital word to the frequency control input 8 of the direct digital synthesiser 5 to commence the next frequency sweep of the frequency swept synthesised output signal, and so operation of the digital frequency synthesiser 1 continues in this mode of operation.

Referring now to FIG. 6, in this mode of operation the frequency swept synthesised output signal is produced by the digital frequency synthesiser 1 on the output terminal 7 in frequency bursts. In this mode of operation the frequency swept synthesised output signal is produced from both frequency domain data and time domain data stored in the data storing circuit 12. On detecting the rising edge of a pulse P of the logic control signal A on the control terminal 20, the data processing circuit 25 initialises itself during an initialisation period J (not shown), but similar to the initialisation period J of FIGS. 3 to 5. During initialisation the data processing circuit 25 reads data indicative of the mode in which the digital frequency synthesiser 1 is to be operated from the sixth data storing register 19. The data processing circuit 25 then reads the data indicative of the start frequency from the first data storing register 14, the data indicative of the increment by which the frequency is to be incremented between frequency steps from the second data storing register 15, and the data indicative of the number of increments by which the frequency is to be incremented from the start frequency from the third data storing register 16, and computes the values of the frequency control digital word from the data read from the first, second and third data storing registers 14 to 16. The data processing circuit 25 reads the data indicative of the duration of the respective frequency steps from the fourth data storing register 17, and the data indicative of the duration of each frequency burst from the fifth data storing register 18. In this mode of operation the durations of each frequency step and each frequency burst are functions of respective numbers of cycles of the frequency swept synthesised output signal, and while the frequency sweep has a relationship with respect to time, the relationship is not linear, since the respective durations of the frequency steps and the frequency bursts decrease as the frequency of the frequency swept synthesised output signal increases. The data processing circuit 25 computes the number of cycles of the frequency swept synthesised output signal corresponding to the duration D of the respective frequency steps of the frequency sweep of the frequency swept synthesised output signal, and the number of cycles of the frequency swept synthesised output signal corresponding to the duration S of the respective frequency bursts. In this embodiment of the invention for ease of illustration, the duration S of each frequency burst corresponds to two cycles of the frequency swept synthesised output signal. However, it will be appreciated that the duration of each frequency burst may be of any desired duration equal to or greater than one cycle of the frequency swept synthesised output signal.

On completion of initialisation, the data processing circuit 25 applies the start value of the frequency control digital word to the frequency control input 8 of the direct digital synthesiser 5 for the duration S of the frequency burst of the first frequency of the frequency sweep. At the end of the duration S, in other words, after two cycles of the frequency swept synthesised output signal, the data processing circuit 25 applies a reset signal to the reset input 11 and a burst control signal to the burst control input 13 of the direct digital synthesiser 5 for operating the direct digital synthesiser 5 to output a steady state signal on the output terminal 7, until the end of the duration D of the first frequency step. At the end of the duration D of the first frequency step, the second value of the frequency control digital word is applied by the data processing circuit 25 to the frequency control input 8, and the reset signal and the burst control signal are removed from the reset input 11 and the burst control input 13, thereby operating the direct digital synthesiser to produce the frequency burst of duration S in the second frequency step of the frequency sweep, and so on until the end of the frequency step in which the frequency burst of the highest frequency of the frequency sweep has been produced. At that stage the data processing circuit 25 again initialises itself and applies the first value of the frequency control digital word for the duration S to the frequency control input 8 of the direct digital synthesiser 5 to commence the next frequency sweep of the frequency swept synthesised output signal. In this mode of operation the digital frequency synthesiser 1 operates in similar fashion as it operates for producing the frequency swept synthesised output signal of FIG. 3, with the exception that the frequencies of the frequency swept synthesised output signal are produced in frequency bursts, rather than continuously for the duration of the respective frequency steps, and the durations of the frequency steps and the frequency bursts are determined based on appropriate numbers of cycles of the frequency swept synthesised output signal.

Referring now to FIG. 7, the digital frequency synthesiser 1 is operated to produce the frequency swept synthesised output signal on the output terminal 7 in frequency bursts also. In this mode of operation the frequency swept synthesised output signal is produced from frequency domain data only stored in the data storing circuit 12, and the time domain of the frequency swept synthesised output signal is determined by the logic control signal A applied to the control terminal 20. On detecting the rising edge of the first pulse of the logic control signal A, the data processing circuit 25 commences initialisation during an initialisation period J (not shown) but similar to that of FIGS. 3 to 5. The data processing circuit 25 reads data indicative of the mode in which the digital frequency synthesiser 1 is to be operated from the sixth data storing register 19. The data processing circuit 25 then reads the data indicative of the start frequency, the increment by which the frequency is to be incremented between frequency steps, and the number of increments or decrements from the first, second and third data storing registers 14, 15 and 16, respectively, and computes the values of the frequency control digital word, and determines the sequence in which the values are to be applied to the frequency control input 8 of the direct digital synthesiser 5.

On completion of initialisation, the data processing circuit 25 applies the start value of the frequency control digital word to the frequency control input 8 of the direct digital synthesiser 5 until the falling edge of the first pulse P of the logic control signal IS A. On detecting the falling edge of the first pulse P, the data processing circuit 25 applies a reset signal to the reset input 11 and a burst control signal to the burst control input 13 of the direct digital synthesiser 5 for operating the direct digital synthesiser 5 to output a steady state signal on the output terminal 7 until the rising edge of the next pulse P of the logic control signal A. At which stage the second value of the frequency control digital word is applied to the frequency control input 8 of the direct digital synthesiser 5 and the reset signal and the burst control signal are removed from the reset input 11 and the burst control input 13 for producing the frequency burst of the second frequency in the second frequency step of the frequency swept synthesised output signal, and so operation of the digital frequency synthesiser 1 continues. In this mode of operation, the operation of the digital frequency synthesiser 1 is substantially similar to that described with reference to FIG. 5, with the exception that the frequency swept synthesised output signal is produced in frequency bursts, rather than with the frequencies being continuously produced during the respective frequency steps. In the mode of operation described with reference to FIG. 7, the ratio of the duration S of each frequency burst to the duration D of the corresponding frequency step is substantially similar to the mark space ratio of the logic control signal on the control terminal 20.

Figure 8:
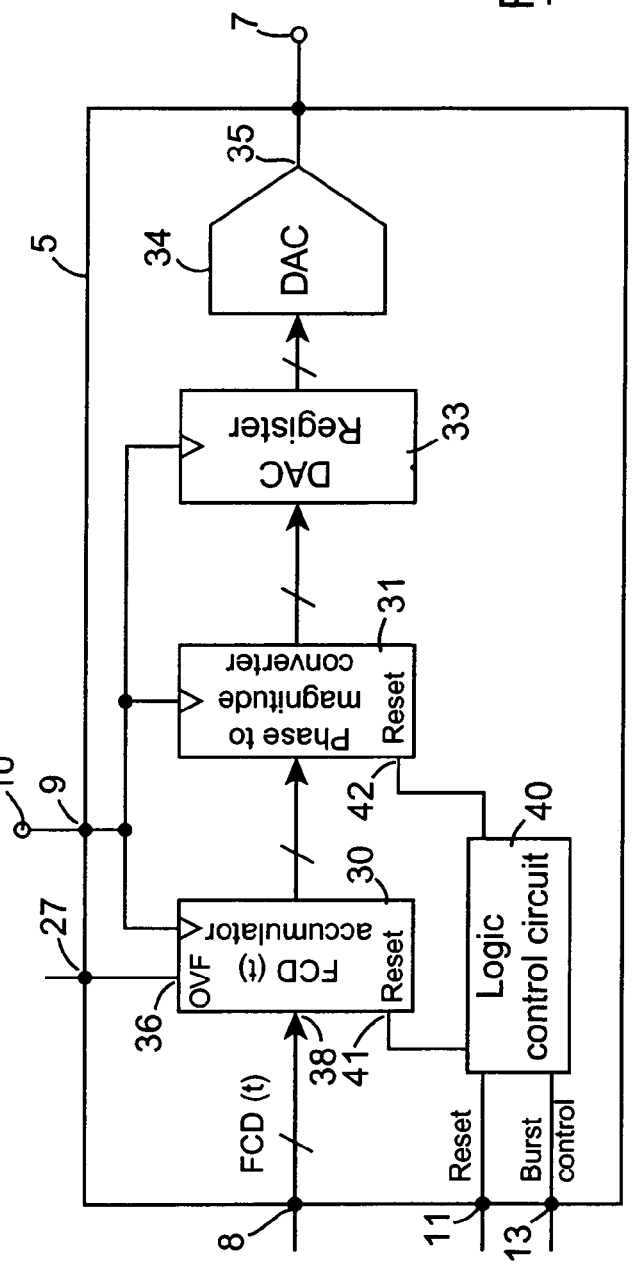
FIG. 8 is a block representation of a portion of the digital frequency synthesiser of FIG. 2.

Referring now to FIG. 8, the direct digital synthesiser 5 of the digital frequency synthesiser 1 will now be described. The direct digital synthesiser 5 comprises a modulo-M accumulator 30 for accumulating the digital value of the frequency control digital word on respective clock cycles of the system clock signal applied to the system clock input 9, during the corresponding frequency step or frequency burst. The accumulated values in the form of digital words of each value of the frequency control digital word from the accumulator 30, which represent the phase of the frequency swept synthesised output signal are applied to a digital signal processing circuit, in this case a phase-to-magnitude converter 31, which produces digital words indicative of the phase dependent magnitude of the frequency swept synthesised output signal, which are in turn applied to a DAC register 33 of a digital-to-analogue converter (DAC) 34. The phase dependent magnitude digital words are converted into analogue voltage values by the DAC 34 to produce the frequency swept synthesised output signal, which is outputted on the output terminal 7 of the digital frequency synthesiser 1. The phase-to-magnitude converter 31 and the DAC register 33 are clocked by the system clock signal. An overflow from an overflow output 36 of the accumulator 30 is applied to the line 26 through the overflow output 27 of the direct digital synthesiser 5 to the data processing circuit 25. The values of the frequency control digital word applied to the frequency control input 8 of the direct digital synthesiser 5 are applied to a corresponding frequency control input 38 of the accumulator 30.

A logic control circuit 40 receives the reset and burst control signals applied to the reset input 11 and the burst control input 13, respectively, of the direct digital synthesiser 5. The logic control circuit 40 is programmed so that in the absence of a burst control signal on the burst control input 13, a reset signal applied on the reset input 11 is applied to a reset input 41 of the accumulator 30 for resetting the accumulator 30 to zero, and to a reset input 42 of the phase-to-magnitude converter 31 for resetting the phase-to-magnitude converter 31. However, when a burst control signal is applied to the burst control signal input 13 of the direct digital synthesiser 5, the logic control circuit 40 only applies a reset signal on the reset input 11 of the direct digital synthesiser 5 to the reset input 42 of the phase-to-magnitude converter 31, in order to operate the phase-to-magnitude converter 31 to produce a digital word which is applied to the DAC register 33 and converted by the DAC 34 to produce the steady state output signal on the output terminal 7 during periods between the end of a frequency burst and the commencement of the next frequency step.

The accumulator 30, the phase-to-magnitude converter 31, the DAC register 33, the DAC 34 and the logic control circuit 40 are implemented on the single chip 2 of the digital frequency synthesiser 1.

In use, referring again to FIG. 2, the data storing circuit 12 is programmed by any suitable programming means through the asynchronous serial interface circuit 22 and the serial communications port 23. For example, programming of the data storing circuit 12 may be carried out by a computer, a microcontroller or any other suitable programming means. The sixth data storing register 19 is programmed with the data indicative of the mode in which the digital frequency synthesiser 1 is to be operated. The first data storing register 14 is programmed with the data indicative of the start frequency of the frequency sweep of the frequency swept synthesised output signal which is to be produced by the digital frequency synthesiser 1. The second data storing register 15 is programmed with the data indicative of the increment or decrement by which the frequency is to be incremented or decremented between frequency steps of the frequency sweep, and the third data storing register 16 is programmed with the data indicative of the number of increments or decrements by which the frequency is to be incremented or decremented during the frequency sweep.

If the duration of the frequency steps of the frequency sweep are not to be determined by a logic control signal applied to the control terminal 20, the fourth data storing register 17 is programmed with data indicative of the duration D of each frequency step of the respective frequency steps. On the other hand, if the frequency steps are to be controlled by a logic control signal on the control terminal 20, programming of the fourth data storing register 17 is not required. If the frequency swept synthesised output signal is not to be produced in frequency bursts, then programming of the fifth data storing register is not required. However, if the frequency swept synthesised output signal is to be produced in frequency bursts, and if the duration of the frequency bursts are not to be determined by a logic control signal applied to the control terminal 20, the fifth data storing register 18 is programmed with data indicative of the duration S of the respective frequency bursts. Otherwise, if the duration S of the frequency burst is to be determined by a logic control signal applied to the control terminal 20, programming of the fifth data storing register 18 is not required.

Once programming of the data storing circuit 20 has been completed, the digital frequency synthesiser 1 is responsive to a rising edge of a first pulse of a logic control signal on the control terminal 20 for initialisation of the data processing circuit 25, and commencement of the frequency swept synthesised output signal. The frequency swept synthesised output signal is then produced in accordance with the mode selected and programmed into the sixth data storing register 19.

While five modes of operation of the digital frequency synthesiser 1 have been described with reference to FIGS. 3 to 7, it will be readily apparent to those skilled in the art that the digital frequency synthesiser 1 may be operated in many more modes than those described. For example, as discussed above, instead of the frequency sweep of the frequency swept synthesised output signal being linear with respect to time, the frequency sweep may have other relationships with respect to time. For example, the digital frequency synthesiser 1 may be programmed to operate in a mode in which the duration of the frequency steps would be a function of number of cycles of the frequency swept synthesised output signal as described with reference to FIG. 6. In which case the duration of the frequency steps would decrease as the frequency of the frequency sweep increased, and vice versa. Similarly, if desired, the frequency bursts could be produced to be of duration which would be a function of a number of cycles of the frequency swept synthesised output signal, as described with reference to FIG. 6.

Additionally, while the frequency sweep of the respective frequency swept synthesised output signals described with reference to FIGS. 3 to 7 have been described with the frequencies of the frequency sweep increasing in ascending order of frequency, it will be readily apparent to those skilled in the art that the frequency sweep could be produced in descending order of frequencies, and further, it will be readily apparent that the digital frequency synthesiser 1 may be operated to produce a frequency swept synthesised output signal in which the frequency sweep is alternatively produced in ascending order of frequency and descending order of frequency. In other words, when the frequency of the frequency sweep reached the end frequency, instead of reverting to the start frequency, the digital frequency synthesiser could be operated to decrement the frequencies from the end frequency to the start frequency, and then commence incrementing the frequencies during the next frequency sweep, and so on.

Figure 9:
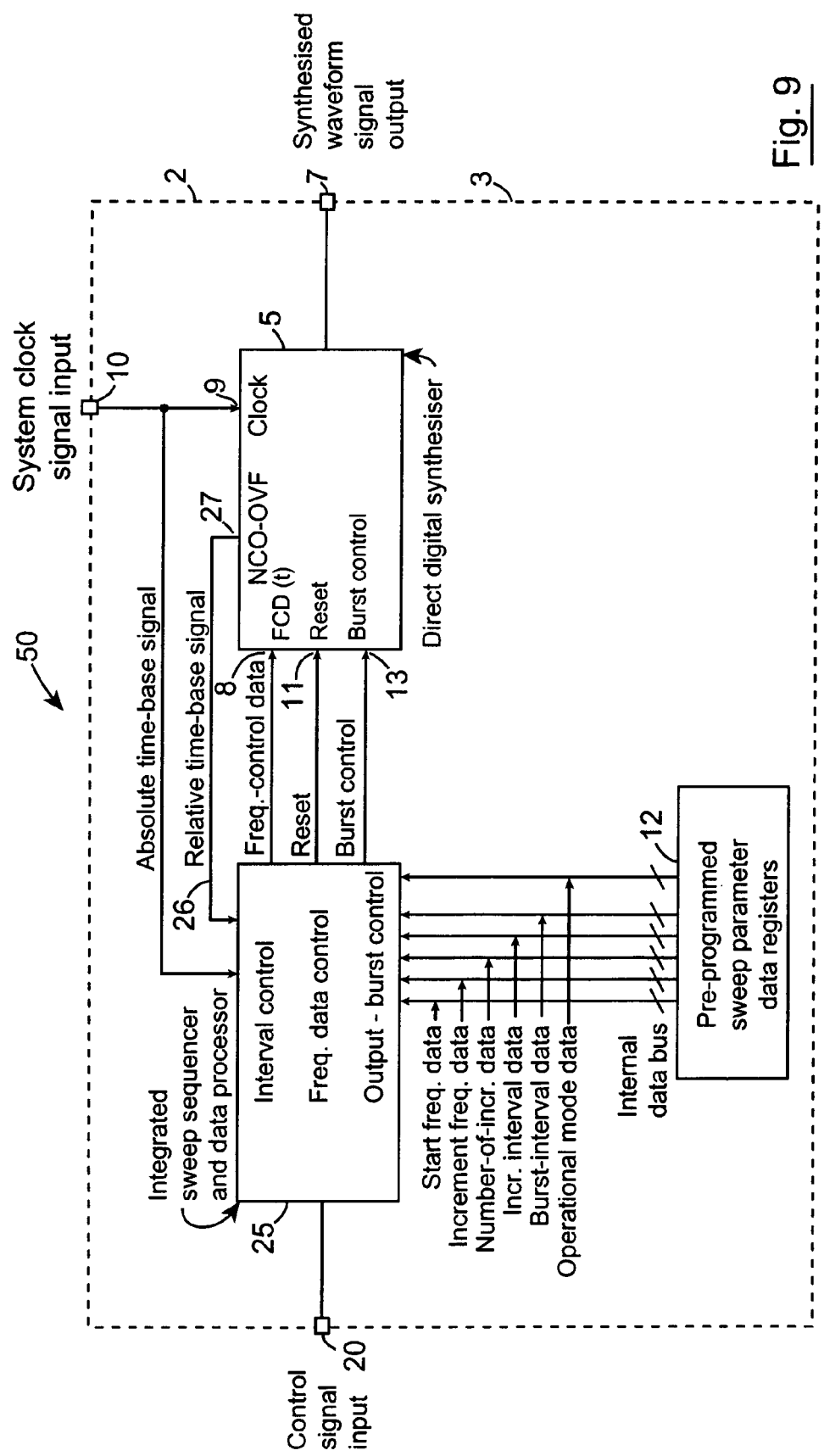
FIG. 9 is a block representation of a digital frequency synthesiser according to another embodiment of the invention for producing a synthesised output signal, the frequency of which is swept through a plurality of frequencies of a frequency sweep.

Referring now to FIG. 9, there is illustrated a digital frequency synthesiser 50 according to another embodiment of the invention, indicated generally by the reference numeral 50. The digital frequency synthesiser 50 is substantially similar to the digital frequency synthesiser 1, and similar components are identified by the same reference numerals. The main difference between the digital frequency synthesiser 50 and the digital frequency synthesiser 1 is that the data storing circuit 12 is not programmable. Accordingly, data defining the frequency domain, and if appropriate the time domain of the frequency sweep of the frequency swept synthesised output signal are pre-programmed into the data storing circuit, which may be provided in the form of data storing registers, or any other suitable data storing means. Otherwise, the digital frequency synthesiser 50 and its operation is similar to the digital frequency synthesiser 1, and is likewise implemented as a single chip digital frequency synthesiser, and is formed entirely on the single chip 2. While the data processing circuit 25 has not been described in detail, it will be readily apparent to those skilled in the art that any suitable data processing circuit may be used which is capable of reading digital data indicative of the frequency and time domain data stored in the first to the sixth registers 14 to 19, respectively, of the data storing circuit 12 and computing values of the frequency control digital word to be applied to the direct digital synthesiser 5, and for determining the sequence in which the values of the frequency control digital word are to be applied to the direct digital synthesiser, as well as for counting either the clock cycles of the system clock, or overflows from the accumulator 30 for determining the duration of the frequency steps, and the frequency bursts, if appropriate, or alternatively, for reading the control terminal 20 for determining the time domain of the frequency swept synthesised output signal from a logic control signal applied to the control terminal 20.

While the waveform of the frequency swept synthesised output signals have been described as being sinusoidal waveforms, any other suitable oscillating or repetitive signal may be produced by the digital frequency synthesisers according to the invention, for example, a logic signal, an arbitrary signal or any other signal.

While, apart from initialisation, the values of the frequency control digital word have been described as being applied to the frequency control input of the direct digital synthesiser without resetting the accumulator, if desired, the accumulator could be reset by a reset signal from the data processing circuit 25 applied on the reset input of the digital frequency synthesiser each time a new value of the frequency control digital word is applied to the direct digital synthesiser. Additionally, it will be appreciated that while it is desirable, it is not essential to reset the accumulator even during initialisation of the data processing circuit prior to the value of the frequency control digital word corresponding to the start frequency of the frequency sweep being applied to the accumulator.

While the data storing circuit has been described as comprising data storing registers, any other suitable data storing means or circuitry may be provided for storing the frequency domain data of a frequency swept synthesised output signal and the operating mode data, and if appropriate, the time domain data also.

While in the embodiments of the invention described, the direct digital synthesiser has been described as comprising a phase-to-magnitude converter for converting the digital data indicative of the phase of the frequency swept synthesised output signal produced by the accumulator to data words representative of the phase dependent magnitude of the frequency swept synthesised output signal, any other suitable digital signal processing circuit for producing phase dependent magnitude data may be used. Additionally, in certain cases, it is envisaged that the overflow bit outputted by the accumulator, the MSB of the digital data outputted by the accumulator, or the MSB of the digital data outputted by the phase-to-magnitude converter, which are representative of the phase of the synthesised output signal, or other digital signals or combinations thereof, may be converted to a logic signal to form the frequency swept synthesised output signal, which would then be in the form of a logic signal, such as a digital signal of stepped frequencies of the frequency sweep.

While the digital frequency synthesiser has been described as providing the frequencies of the frequency sweep in steps of progressively increasing frequency, the frequency sweep could be provided in steps of progressively decreasing frequencies, or in any other pattern, randomly generated or otherwise.

Additionally, it is envisaged that the data processing circuit may be programmed so that at the end of each frequency sweep, the next frequency sweep would be reversed, in other words, after a frequency sweep in which the frequency is progressively increased from the lowest frequency to the highest frequency, the next frequency sweep could be provided with the frequencies of the frequency sweep being progressively decreased from the highest to the lowest frequencies of the frequency sweep, and vice versa. In which case, successive frequency sweeps would define a triangular profile.

While the frequency swept synthesised output signals produced by the digital frequency synthesisers according to the invention when produced in frequency bursts have been described as comprising a single frequency burst in each frequency step, it will be readily apparent to those skilled in the art that the frequency swept synthesised output signals may be produced with a number of frequency bursts in each frequency step.

The invention claimed is:

1. A digital frequency synthesiser for producing a frequency swept synthesised output signal, the digital frequency synthesiser being implemented on a single chip, and comprising:
an on-chip direct digital frequency synthesiser for producing the synthesised output signal of frequency directly responsive to a frequency control digital word applied thereto,
an on-chip data storing circuit for storing data defining a frequency sweep of the frequency swept synthesised output signal in the frequency domain and in the time domain,
a single pin control terminal adapted for receiving an externally generated logic control signal,
an on-chip data processing circuit for determining from the frequency domain data stored in the data storing circuit respective values of the frequency control digital word and the sequence thereof in which the values of the frequency control digital word are to be applied to the direct digital frequency synthesiser for producing the frequency swept synthesised output signal, the data processing circuit being responsive to one of the data stored in the data storing circuit defining the time domain of the frequency sweep, a logic control signal applied to the control terminal, and a combination of a logic control signal applied to the control terminal and data stored in the data storing circuit defining the time domain of the frequency sweep for determining the rate at which the values of the frequency control digital word are to be applied to the direct digital frequency synthesiser and for applying the values of the frequency control digital word in the sequence and at the determined rate to the direct digital frequency synthesiser for producing the frequency swept synthesised output signal.

2. A digital frequency synthesiser as claimed in claim 1 in which the data storing circuit is adapted for storing the frequency domain data in the form of data indicative of one of a start frequency and an end frequency of the frequency sweep of the frequency swept synthesised output signal.

3. A digital frequency synthesiser as claimed in claim 1 in which the data storing circuit is adapted for storing the frequency domain data in the form of data indicative of one of a frequency increment and a frequency decrement by which the frequency is to be altered between consecutive frequency steps of the frequency sweep of the frequency swept synthesised output signal.

4. A digital frequency synthesiser as claimed in claim 1 in which the data storing circuit is adapted for storing the frequency domain data in the form of data indicative of the number of frequency steps of the frequency sweep of the frequency swept synthesised output signal.

5. A digital frequency synthesiser as claimed in claim 1 in which the data storing circuit is adapted for storing the time domain data in the form of data indicative of the duration of each frequency step of the frequency sweep of the frequency swept synthesised output signal.

6. A digital frequency synthesiser as claimed in claim 1 in which the data storing circuit is adapted for storing the time domain data in the form of data indicative of the duration of a frequency burst of a frequency step of the frequency sweep of the frequency swept synthesised output signal.

7. A digital frequency synthesiser as claimed in claim 1 in which the data processing circuit is responsive to a logic control signal applied to the control terminal for determining when a first value of the sequence of values of the frequency control digital word is to be applied to the direct digital frequency synthesiser.

8. A digital frequency synthesiser as claimed in claim 1 in which the data processing circuit is responsive to a control signal applied to the control terminal for determining the time domain of the frequency sweep of the frequency swept synthesised output signal.

9. A digital frequency synthesiser as claimed in claim 1 in which the data processing circuit is responsive to a logic control signal applied to the control terminal for determining the duration of each frequency step of the frequency swept synthesised output signal.

10. A digital frequency synthesiser as claimed in claim 1 in which the data processing circuit is responsive to a rising edge and a falling edge of a logic control signal applied to the control terminal for determining the duration of a frequency burst of a frequency step of the frequency sweep of the frequency swept synthesised output signal for producing the frequency swept synthesised output signal in frequency bursts.

11. A digital frequency synthesiser as claimed in claim 1 in which the data processing circuit is responsive to the mark space ratio of a logic control signal applied to the control terminal for determining the ratio of the duration of a frequency burst of a frequency step of the frequency swept synthesised output signal to the duration of the frequency step.

12. A digital frequency synthesiser as claimed in claim 1 in which the data processing circuit is adapted for computing the time domain data of the frequency sweep as a function of a number of cycles of an oscillating signal from the time domain data stored in the data storing circuit, and the data processing circuit is responsive to the oscillating signal for determining the rate at which the values of the frequency control digital word are to be applied to the direct digital frequency synthesiser.

13. A digital frequency synthesiser as claimed in claim 12 in which the data processing circuit is responsive to the oscillating signal for determining the duration of each frequency step of the frequency swept synthesised output signal.

14. A digital frequency synthesiser as claimed in claim 12 in which the data processing circuit is responsive to the oscillating signal for determining the duration of a frequency burst of a frequency step of the frequency sweep of the frequency swept synthesised output signal for producing the frequency swept synthesised output signal in frequency bursts.

15. A digital frequency synthesiser as claimed in claim 12 in which the oscillating signal to which the data processing circuit is responsive is a system clock signal at which the digital frequency synthesiser is clocked.

16. A digital frequency synthesiser as claimed in claim 15 in which the system clock signal is an externally generated system clock signal, and a clock terminal is provided for receiving the system clock signal.

17. A digital frequency synthesiser as claimed in claim 12 in which the oscillating signal is the frequency swept synthesised output signal.

18. A digital frequency synthesiser as claimed in claim 1 in which the direct digital frequency synthesiser comprises a numerical controlled oscillator responsive to the values of the frequency control digital word for sequentially producing digital words indicative of the phase of the frequency swept synthesised output signal.

19. A digital frequency synthesiser as claimed in claim 18 in which the numerical controlled oscillator comprises a modulo-M accumulator responsive to the values of the frequency control digital word for sequentially producing the digital words indicative of the phase of the frequency swept synthesised output signal.

20. A digital frequency synthesiser as claimed in claim 19 in which the data processing circuit is responsive to an overflow signal from the accumulator for determining the rate at which the values of the frequency control digital word are to be applied to the accumulator.

21. A digital frequency synthesiser as claimed in claim 18 in which the direct digital frequency synthesiser comprises a digital signal processing circuit for producing phase dependent magnitude digital words from the digital words indicative of the phase of the frequency swept synthesised output signal produced by the numerical controlled oscillator.

22. A digital frequency synthesiser as claimed in claim 21 in which the direct digital frequency synthesiser comprises a DAC for converting the phase dependent magnitude digital words produced by the digital signal processing circuit to the frequency swept synthesised output signal.

23. A digital frequency synthesiser as claimed in claim 1 in which the data storing circuit is programmable for facilitating programming of the frequency domain data of the frequency swept synthesised output signal.

24. A digital frequency synthesiser as claimed in claim 1 in which the data storing circuit is programmable for facilitating programming of the time domain data of the frequency swept synthesised output signal.

25. A digital frequency synthesiser as claimed in claim 1 in which the data storing circuit is programmable for facilitating selection of a mode of operation in which the digital frequency synthesiser is to be operated.

26. A digital frequency synthesiser as claimed in claim 1 in which the digital frequency synthesiser is adapted for producing the frequency swept synthesised output signal in the form of a sine wave.

27. A digital frequency synthesiser as claimed in claim 1 in which the digital frequency synthesiser is adapted for producing the frequency swept synthesised output signal in the form of an arbitrary signal.

28. A digital frequency synthesiser as claimed in claim 1 in which the digital frequency synthesiser is adapted for producing the frequency swept synthesised output signal in the form of a logic signal.

29. A method for producing a frequency swept synthesised output signal, the method comprising:
  implementing a digital frequency synthesiser on a single chip, whereby the digital frequency synthesiser comprises:
    an on-chip direct digital frequency synthesiser for producing a synthesised output signal of frequency directly responsive to a frequency control digital word applied thereto,
    an on-chip data storing circuit for storing data defining a frequency sweep of the frequency swept synthesised output signal in the frequency domain and in the time domain,
    a single pin control terminal adapted for receiving an externally generated logic control signal,
    an on-chip data processing circuit for determining from the frequency domain data stored in the data storing circuit respective values of the frequency control digital word and the sequence thereof in which the values of the frequency control digital word are to be applied to the direct digital frequency synthesiser for producing the frequency swept synthesised output signal, the data processing circuit being responsive to one of the data stored in the data storing circuit defining the time domain of the frequency sweep, a logic control signal applied to the control terminal, and a combination of a logic control signal applied to the control terminal and data stored in the data storing circuit defining the time domain of the frequency sweep for determining the rate at which the values of the frequency control digital word are to be applied to the direct digital frequency synthesiser, and
  operating the data processing circuit for determining from the frequency domain data stored in the data storing circuit respective values of the frequency control digital word and the sequence thereof in which the values of the frequency control digital word are to be applied to the direct digital frequency synthesiser for producing the synthesised output signal,
  operating the data processing circuit for determining the rate at which the values of the frequency control digital word are to be applied to the direct digital frequency synthesiser from one of the data stored in the data storing circuit defining the time domain of the frequency sweep, a logic control signal applied to the control terminal, and a combination of a logic control signal applied to the control terminal and data stored in the data storing circuit defining the time domain of the frequency sweep,
  operating the data processing circuit for applying the values of the frequency control digital word in the sequence and at the determined rate to the direct digital frequency synthesiser for producing the frequency swept synthesised output signal.

30. A method as claimed in claim 29 in which the data storing circuit is adapted for storing the frequency domain data in the form of data indicative of one of a start frequency and an end frequency of the frequency sweep of the frequency swept synthesised output signal.

31. A method as claimed in claim 29 in which the data storing circuit is adapted for storing the frequency domain data in the form of data indicative of one of a frequency increment and a frequency decrement by which the frequency is to be altered between consecutive frequency steps of the frequency sweep of the frequency swept synthesised output signal.

32. A method as claimed in claim 29 in which the data storing circuit is adapted for storing the frequency domain data in the form of data indicative of the number of frequency steps of the frequency sweep of the frequency swept synthesised output signal.

33. A method as claimed in claim 29 in which the data storing circuit is adapted for storing the time domain data in the form of data indicative of the duration of each frequency step of the frequency sweep of the frequency swept synthesised output signal.

34. A method as claimed in claim 29 in which the data storing circuit is adapted for storing the time domain data in the form of data indicative of the duration of a frequency burst of a frequency step of the frequency sweep of the frequency swept synthesised output signal.

* * * * *